United States Patent [19]

Usuda et al.

[11] Patent Number: 5,102,521
[45] Date of Patent: Apr. 7, 1992

[54] HORIZONTAL CARRYING TAPE ELECTROPLATING APPARATUS

[75] Inventors: Hitoshi Usuda, Kanuma; Ryoei Yamakawa, Utsunomiya; Kenichi Ueno, Fujisawa; Kazuhiro Hirao, Hadano, all of Japan

[73] Assignees: Almex Inc., Tokyo; Permelec Electrode Ltd., Fujisawa, both of Japan

[21] Appl. No.: 740,509

[22] Filed: Aug. 5, 1991

[30] Foreign Application Priority Data

Aug. 15, 1990 [JP] Japan .................. 2-215638

[51] Int. Cl.⁵ .......................... C25D 17/00
[52] U.S. Cl. .................. 204/198; 204/266; 204/278
[58] Field of Search .............. 204/198, 266, 278

[56] References Cited

U.S. PATENT DOCUMENTS 4,832,811  5/1989  Hosten ................ 204/198

FOREIGN PATENT DOCUMENTS 297884  11/1989  Japan .

Primary Examiner—T. M. Tufariello
Attorney, Agent, or Firm—Spencer & Frank

[57] ABSTRACT

According to the present invention, an upper electrode and a lower electrode are integrally assembled with insoluble electrodes and diaphragmn in diaphragm electrode structure. Small holes are furnished on the upper electrode, and the diaphragm of the upper electrode is installed obliquely with degassing means. By simply carrying the objects to be plated in horizontal direction, uniform and high quality electroplating can be continuously performed with extensive increase in productivity, while enjoying all of the benefits such as shorter interpolar distance between two electrodes, compact design of the apparatus, saving of expensive additives, etc. Further, the inspection of the diaphragm and the like can be rapidly and easily accomplished, and perfect protection of the diaphragm is assured, thus providing a horizontal carrying type electroplating apparatus suitable for practical use.

7 Claims, 4 Drawing Sheets

HORIZONTAL CARRYING TAPE ELECTROPLATING APPARATUS

BACKGROUND OF THE INVENTION

In case plating is performed on an object in planar shape such as a printed board for example, there are two methods: intermittent carrying method for intermittently carrying the objects to be plated by hanging it vertically by crane, and horizontal carrying method for continuously carrying the objects to be plated into a plating tank by horizontal transport means. The former is also called the batching processing, and the latter the continuous processing. On the other hand, the system is divided into soluble electrode type and insoluble electrode type according to the sturcture of the anode used.

Describing the intermittent carrying type in detail, in a plating equipment of soluble electrode type as shown in FIG. 5, 1 represents a plating tank, 5 a printed board (object to be plated) tank, 5 a printed board (object to be plated) supported by a carrying rod 6, and 21' and 21' are anodes supported by power feeding hangers 2 and 2. This anode 21' comprises a mesh-like cylinder accommodating balls, chips, etc. of copper or copper alloy.

In such plating apparatus, however, troublesome procedure is required for maintenance and control of copper ion concentration in the plating solution because the anode (such as copper ball) 21' is soluble, and much labor and time are required for supply and replacement of the anodes itself. Further, in order to prevent non-uniformity of the plating film thickness caused by the change of interpolar distance due to wearing of anode, the interpolar distance 1 must be increased. This involves such problems as the large-size equipment or the increase of initial make-up of electrolytic bath.

To solve the above problems, it has been proposed to use isoluble anode and to supply copper ions, generated in a separate copper dissolving tank, to the plating tank. However, in case of such insoluble anode, equilibrium potential is increased compared with a soluble anode, and this enhances oxidizing decomposition of the additives (such as polyether, organic sulfur compound, etc.) by positive polarization. As the result, the consumption of the additives is increased, and this in turn raises the cost of electroplating, resulting in the problems caused by the introduction of insoluble anode.

To ensure stable long-term use of additive by preventing the decomposition of the additives and to facilitate the plating solution control, a method to separate the anode (21) from the object to be plated (5) by a diaphragm has been proposed (e.g. Japanese Provisional Patent Publication No. 297884/1989).

Specifically, as shown in FIG. 6, insoluble plate electrode is used as anode 21, and a diaphragm 31 is provided between the anodes 21 and the object to be plated 5. In such insoluble electrode system, most of the plating solution containing the additive is not brought into direct contact with the anode 21, and this prevents the decomposition of the additive and minimizes the use of expensive reagents.

However, even in this insoluble electrode system, the diaphragm 31 is eaily deformed or broken, and it is difficult to inspect and replace the diaphragm 31. The present applicant previously proposed an integrated type apparatus as shown in FIG. 4, in which an insoluble electrode 21 and a diaphragm 31 are placed in a liquid-tight main unit case 11 and the diaphragm 31 is covered by rib member 41 (Japanese Patent Application No. 215636/1990). In FIG. 4, 15 represents a spacer, and S denotes an accommodation space, i.e. closed space, for the electrode 21. By such arrangement, the diaphragm 31 can be protected perfectly, and inspection can be rapidly and easily performed. Also, uniform current distribution can be assured by the separation effect of the upright planes 42a formed by a plurality of grids 42.

In the batch processing system by intermittent carrying type, it is apparently advantageous for the improvement of productivity and compact design of the equipment to provide a continuous processing system, in which soluble anodes 21' are arranged above and below of a plating tank 1 as shown in FIG. 5 or insoluble anodes 21 and diaphragms 31 are furnished above and below in the plating tank 1 as shown in FIG. 6, and the object to be plated 5 is carried horizontally by a conveyor through the space between them.

However, the continuous processing system of horizontal carrying type is not widely used at present.

The reasons for this may be as follows: In case the soluble anodes 21' are furnished above and below as shown in FIG. 5, non-uniformity of plating film thickness caused by the change of interpolar distance due to wearing of anode as explained in the above batch processing becomes more conspicuous and the replacement of the anode itself is also difficult. On the other hand, in case the insoluble anodes 21 are furnished above and below as shown in FIG. 6, the inspection and replacement of the diaphragms 31 becomes more complicated and difficult.

In this respect, the present applicant has studied and produced a continuous processing system on trial by adopting the above integrated type diaphragm electrode structure (11, 21, 31 and 41) as proposed previously (Japanese Patent Application No. 215636/1990). Although perfect protection can be provided for the diaphragm 31 and the inspection and replacement of the diaphragm 31 are done easier in this system, new problems have risen such as wide variation of plating film thickness due to the stagnation of the gas generated from insoluble anode 21 in the closed space S formed by main unit case 11 and diaphragm 31, and the difficulty for feeding electric current smoothly. Particularly, in case of copper plating on plate type printed board having through-hole, the proposed system cannot be used practically.

SUMMARY OF THE INVENTION

To eliminate the above problems, the object of the present invention si to offer a horizontal carrying type electroplating apparatus making it possible to produce uniform plating film smoothly and efficiently with high productivity by introducing insoluble electrode structure with perfect degassing.

The horizontal carrying type electroplating apparatus according to the present invention comprises an upper electrode and a lower electrode place face-to-face in a plating tank and for performing electroplating by carrying the plate type objects to be plated in horizontal direction between two electrodes, characterized in that said upper electrode and said lower electrode are placed face-to-face and covered with a diaphragm to form a closed space where insoluble plate electrode is furnished in diaphragm electrode structure, a plurality of small holes penetrating both sides of insoluble plate electrode are provided on the diaphragm electrode structure of the upper electrode, degassing holes are furnished on upper portion of said closed space, the diaphragm of diaphragm electrode structure of the lower electrode is installed obliquely on the bottom surface of a plating tank, and degassing holes are provided on the higher side of the diaphragm in the closed space.

According to the present invention with the above arrangement, plating film can be formed efficiently on upper and lower surfaces of the objects to be plated when the plate type objects are carried horizontally between upper and lower electrodes of the diaphragm electrode structure.

In this case, the gas generated from lower surface of the upper electrode passes through small holes on the insoluble plate electrode, and it is moved toward the upper surface and is discharged out of the diaphragm electrode structure through the degassing holes. At the same time, the gas generated from upper surface of the lower electrode moves upward along the inclined surface of the diaphragm and is discharged out of the diaphragm electrode structure through the degassing hole on the higher side.

Accordingly, gas is not stagnated between each of the insoluble plate electrodes and the objects to be plated. This ensures smooth current flow and uniform and high quality plating with high efficiency on both sides of the objects to be plated.

Moreover, because upper and lower electrodes are designed in integrated diaphragm electrode structure, there is no need to use expensive additives, and the inspection of diaphragm can be easily and quickly perfomed.

Specifically, the apparatus according to the present invention has such structure that upper electrode and lower electrode are assembled integrally with insoluble plate electrodes and diaphragm, etc., that small holes are provided on the upper electrode, and that the diaphragm is installed obliquely on lower electrode to provide degassing means. Accordingly, the apparatus has such advantages as shorter interpolar distance between two electrodes, compact size of the apparatus, saving of expensive additives, etc., and uniform and high quality plating can be accomplished by simply carrying the objects to be plated in horizontal direction, and the productivity can be extensively increased. Further, the inspection of diaphragm can be rapidly and easily achieved, and perfect protection can be provided for the diaphragm. Thus, a horizontal carrying type electroplating apparatus suitable for practical use can be offered.

BRIEF DESCRIPTION OF THE DRAWINGS

FIG. 5 shows the case with soluble electrodes, and FIG. 6 the case with insoluble electrodes.

Figure 1:
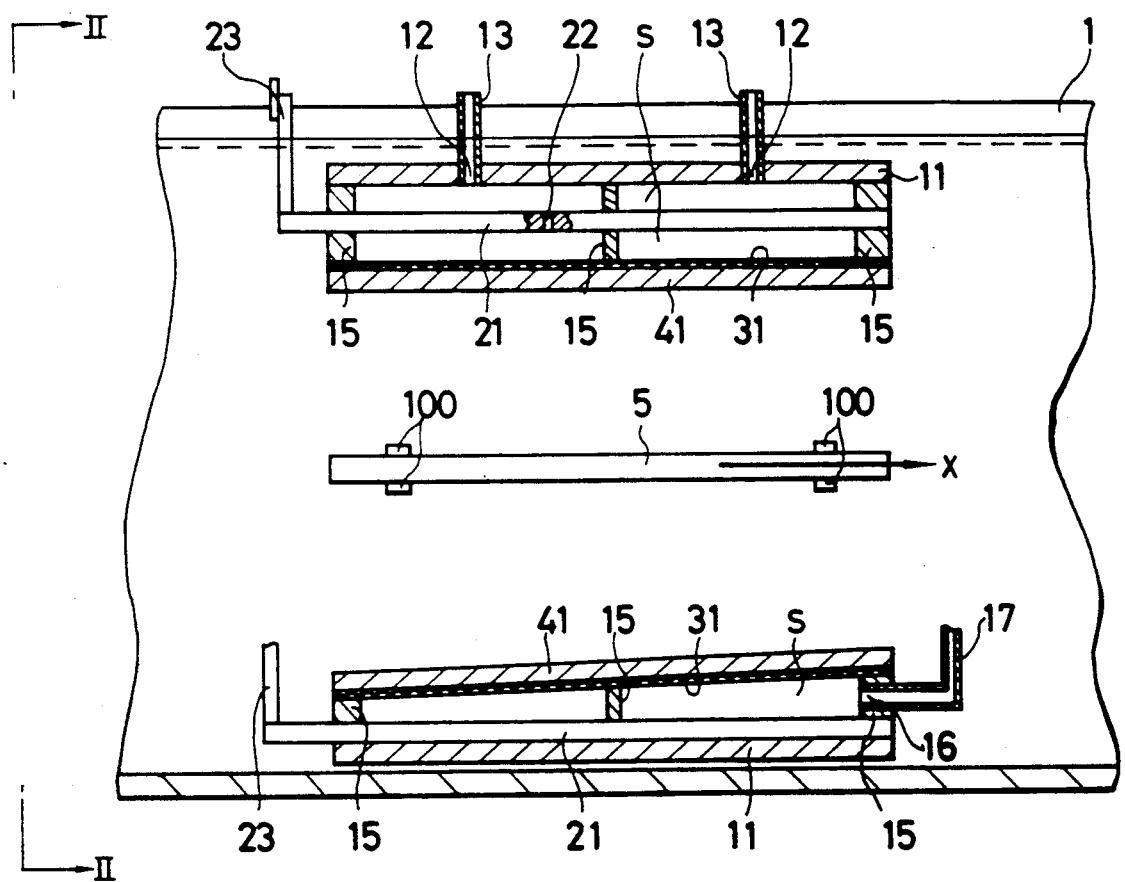
FIG. 1 is a cross-sectional view of an embodiment of the present invention.

In the FIGS. 1 represents a plating tank, 5 and object to be plated, 11 a main unit case, 12 degassing holes, 13 a short pipe 15 spacers, 16 degassing holes, 21 insoluble plate electrodes (upper and lower electrodes), 22 small holes, 31 a diaphragm, 41 rib member, 42 grid, and 100 supporting members of horizontal carrying means.

DESCRIPTION OF THE PREFERRED EMBODIMENT

In the following, an embodiment of the present invention is described in connection with the drawings.

Figure 2:
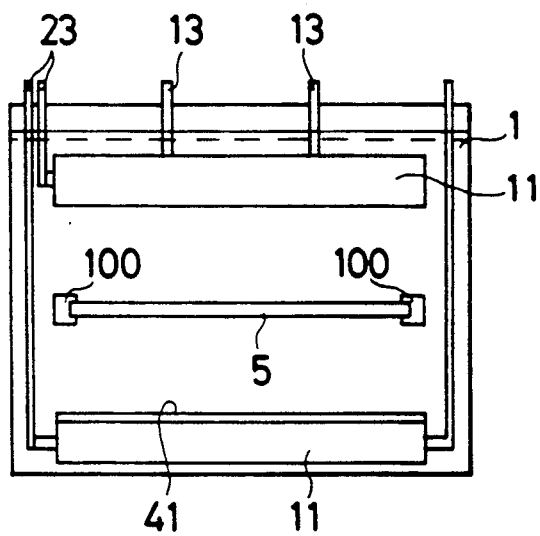
FIG. 2 is a front view along the line II—II of FIG. 1.

As shown in FIG. 1 and FIG. 2, the present electroplating apparatus comprises an upper electrode and a lower electrode placed face-to-face in a plating tank 1, and the object to be plated 5 of plate shape (printed board having through-hole in the present embodiment) are carried horizontally in the direction X in FIG. 1 between these electrodes by supporting them by the supporting members 100 and 100 of horizontal carrying means such as a conveyor. Two electrodes are designed in diaphragm electrodes structure respectively and are provided with degassing means.

The diaphragm electrode structure as referred here is in such arrangement that soluble plate electrode (anode) 21 is placed in a closed space S covered by a diaphragm 31 as shown in FIG. 1. In a main unit case 11, an insoluble plate electrode 21 and a diaphragm 31 are fixed integrally by bolts, while maintaining a certain gap between them through spacers 15, and an insoluble plate electrode 21 is accommodated in the closed space S. Therefore, most of the plating solution containing the additive is not brought into direct contact with the insoluble plate electrode (anode) 21, and the decomposition of the additive can be prevented. At the same time, the anode 21 and the diaphragm 31 can be taken out integrally out of the plating tank 1, and this ensures easy and rapid inspection.

Figure 4:
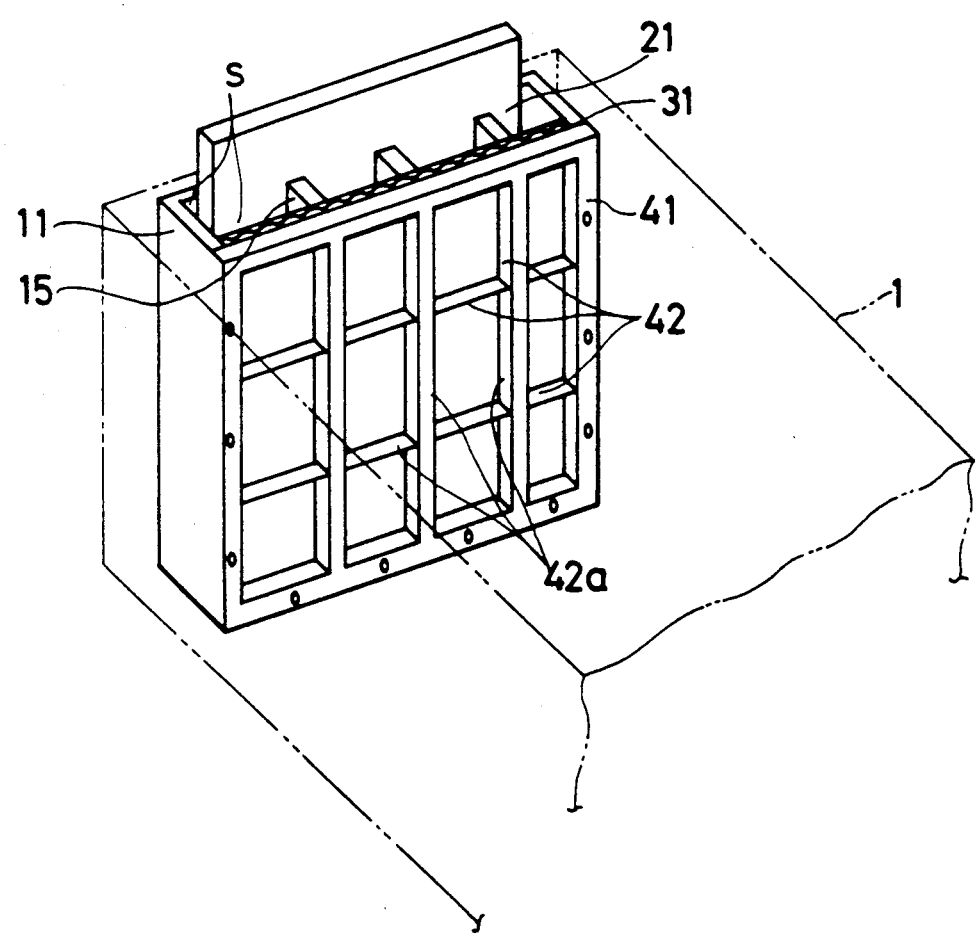
FIG. 4 is a perspective view for explaining basic configuration of an integral type insoluble diaphragm electrode structure.
Figure 5:
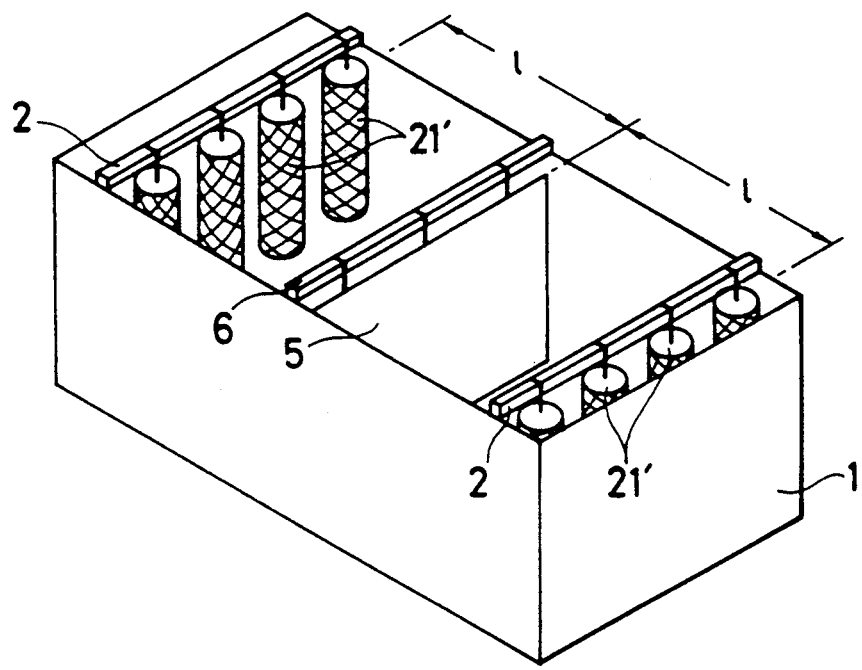
FIG. 5 and FIG. 6 are the drawings of electroplating apparatus of conventional batch processing type.
Figure 6:
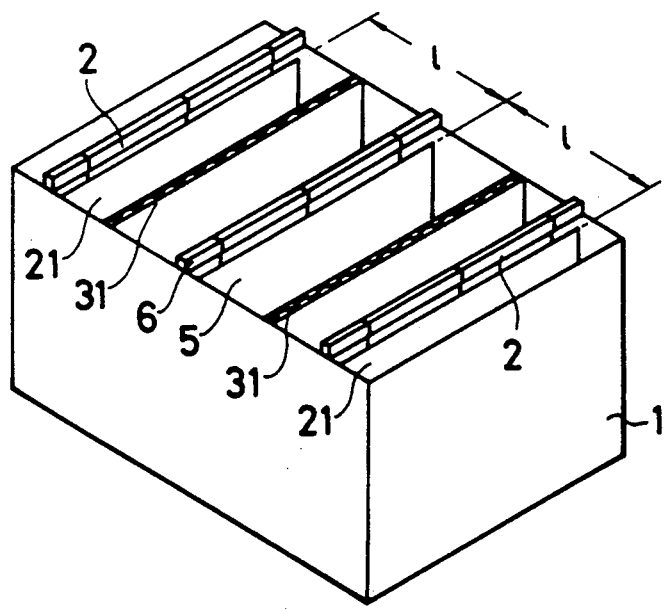

Further, the diaphragm 31 is basically covered by rib member 41 as shown in FIG. 4 from outside. This protects the diaphragm 31 from deformation and damage, and uniform current distribution is assured by the upright surfaces (42a) of the grid (42). Because the entire mechanical strength can be reinforced by the rigidity of main unit case 11 and the rib member 41, the anode 21 itself can be designed in thinner and economical size.

Figure 3:
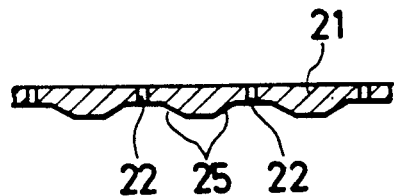
FIG. 3 is a partial enlarged cross-sectional view of an isoluble upper electrode.

As shown in FIG. 1 and FIG. 3, the diaphragm electrode structure of upper electrode is provided with a plurality of small holes 22 penetrating through both sides of the anode 21, and degassing holes 12 are furnished on upper side of the closed space S. In the present embodiment, the degassing holes 12 are guided out of the plating solution through short pipes 13.

Therefore, the gas generated from the lower surface of the anode 21, i.e. from the side facing the objects to be plated 5, passes through the small holes 22 and it is discharged outside through the degassing holes 12. In this case, the recesses 25 near the small holes 22 as shown in FIG. 3 are provided on the lower surface of the anode 21, and this enhances gas collecting effect to ensure smooth degassing. Because the gas is not stagnated within the closed space S, smooth and uniform plating can be accomplished on upper surface and through-hole of the objects to be plated 5.

On the other hand, in the diaphragm electrode structure of the lower electrode, the spacers 15 are furnished with difference in height so that the diaphragm 31 can be inclined with ascending slope toward the carrying direction X of the object to be plated 5 relative to the bottom surface of the plating tank 1 as shown in FIG. 1. Also, degassing holes 16 are furnished downstream of the closed space S (the right side in FIG. 1), and it is guided toward outside by an exhaust pipe 17. Accordingly, the gas generated from upper surface of the anode 21 goes upward along the inner surface of the diaphragm 31 in the closed space S and is discharged outward through the degassing hole 16. Because gas is not stagnated within the closed space S, smooth and uniform plating can be accomplished on lower surface and through-hole of the object to be plated 5.

In an electroplating apparatus with such arrangement, uniform and high quality plating can be continuously accomplished on upper and lower surfaces of the object to be plated 5 when the object of planar shape 5 is horizontally carried between upper and lower electrodes (21 and 21).

According to the present embodiment, upper electrode and lower electrode are formed in integral diaphragm electrode structure, and degassing means (22 and 12) (31' and 16) are provided on these two diaphragm electrode structures. Thus, when the object to be plated 5 is horizontally carried through between these two electrodes, high quality plating can be accomplished efficiently and smoothly with high productivity, while enjoying all of the advantages such as compact design achieved by the adoption of insoluble electrode (anode), the prevention of decomposition of additive, etc.

Each of the diaphragm electrode structures consists of integrated assembly of main unit case 11, insoluble plate electrode 21, diaphragm 31 and rib member 41, and this contributes to perfect protection of the diaphragm 31 and quick and easy inspection of the diaphragm 31. The apparatus is in compact and lightweight design, and this assures rapid propagation of this horizontal carrying type electroplating apparatus.

Because the entire diaphragm electrode structure is in simple, compact and lightweigh design, it is easy to carry it in or out and can be easily installed and fixed in the plating tank 1. Because the space S is small, the initial decomposition of the additive can be minimized, and this ensures ecomonic features of the apparatus.

Each of the components 11, 21, 31 and 41 can be disassembled and assembled by simply loosening or tightening bolts, and the replacement of insoluble electrode 21 and the diaphragm 31 can be achieved quickly and easily. Because the entire apparatus can be carried away by a single person, higher efficiency in transportation is assured.

Degassing effect can be perfectly provided by furnishing adequate number of small holes 22 on the insoluble anode 21 in case of the upper electrode, and by providing adequate inclination angle of the diaphragm 31 in case of the lower electrode. This means easy adjustment to the size of the object to be plated 5 and to its carrying speed, and wide range of adaptability is thus assured. Moreover, simple construction ensures stable degassing, and this contributes to the production of uniform and high quality plating film.

Further, because rib member 41 is designed in grid pattern, the mechanical strength of the entire insoluble electrode structure can be increased. This leads to lightweight and thin design of the insoluble electrode 21 itself and to the reduction of cost.

Each of the grids (42) of rib member (41) has upright surface (42a) perpendicular to the object to be plated 5, and unnecessary flow of the current can be prevented and uniform plating film can be produced.

Further, because the insoluble electrode 21 is formed in plate shape and its size can be freely selected, it is suitable particularly for uniform plating on large-size printed board.

What is claimed is:

1. A horizontal carrying type electroplating apparatus, comprising an upper electrode and a lower electrode placed face-to-face in a plating tank, and plating being performed by carrying object to be plated in plate shape in horizontal direction between two electrodes, characterized in that:

an insoluble plate electrode is provided in a closed space where the opposed surfaces of said upper and lower electrodes are covered by a diaphragm, thus providing a diaphragm electrode structure, a plurality of small holes penetrating both sides are furnished on insoluble electrode plate of the diaphragm electrode structure of upper electrode, and degassing holes are furnished on upper portion of said closed space, and further the diaphragm of the diaphragm electrode structure of lower electrode is installed obliquely relative to the bottom surface of the plating tank, and degassing holes are furnished on the higher side of the diaphragm in the close space.

2. A horizontal carrying type electroplating apparatus according to claim 1, wherein said diaphragm electrode structure is designed in such manner that said insoluble plate electrode and said diaphragm are accommodated in main unit case maintaining a certain gap by spacers.

3. A horizontal carrying type electroplating apparatus according to claim 1, wherein said diaphragm is covered by rib member in grid pattern from outside.

4. A horizontal carrying type electroplating apparatus according to claim 3, wherein the grid of said rib member has its upright surfaces perpendicular to the object to be plated.

5. A horizontal carrying type electroplating apparatus according to claim 1, wherein said degassing holes of the diaphragm electrode structure of said upper electrode are guided out of the plating solution through short pipes.

6. A horizontal carrying type electroplating apparatus according to claim 1, wherein recesses near said small holes are provided on lower surface of insoluble plate electrode of the diaphragm electrode structure of said upper electrode.

7. A horizontal carrying type electroplating apparatus according to claim 1, wherein the diaphragm of diaphragm electrode structure of said lower electrode is installed at inclined position using a plurality of spacers with difference in height.

* * * * *